United States Patent
Riou et al.

(10) Patent No.: US 11,444,543 B2
(45) Date of Patent: Sep. 13, 2022

(54) ELECTRICAL POWER MODULE

(71) Applicant: SAFRAN ELECTRONICS & DEFENSE, Boulogne-Billancourt (FR)

(72) Inventors: Jean-Christophe Riou, Boulogne-Billancourt (FR); Eric Bailly, Boulogne-Billancourt (FR); Nawres Sridi-Convers, Boulogne-Billancourt (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 0 days.

(21) Appl. No.: 16/765,412

(22) PCT Filed: Nov. 16, 2018

(86) PCT No.: PCT/EP2018/081510
§ 371 (c)(1),
(2) Date: May 19, 2020

(87) PCT Pub. No.: WO2019/101634
PCT Pub. Date: May 31, 2019

(65) Prior Publication Data
US 2020/0336078 A1    Oct. 22, 2020

(30) Foreign Application Priority Data
Nov. 21, 2017  (FR) ...................... 1761015

(51) Int. Cl.
*H02M 7/00* (2006.01)
*H05K 7/14* (2006.01)
(Continued)

(52) U.S. Cl.
CPC ............ *H02M 7/003* (2013.01); *H02P 27/06* (2013.01); *H05K 1/0272* (2013.01); *H05K 1/181* (2013.01);
(Continued)

(58) Field of Classification Search
None
See application file for complete search history.

(56) References Cited

U.S. PATENT DOCUMENTS 5,063,475 A * 11/1991 Balan ................. H05K 7/20736
361/679.49
6,642,576 B1 * 11/2003 Shirasawa ............. H01L 25/071
257/288

(Continued)

FOREIGN PATENT DOCUMENTS

DE    29504352 U1    8/1995
EP    0886315 A1    12/1998

*Primary Examiner* — Courtney L Smith
(74) *Attorney, Agent, or Firm* — Muncy, Geissler, Olds & Lowe, P.C.

(57) ABSTRACT

An electrical power module comprising power components and supports, each including at least one metal portion, the metal portions of the supports forming a substrate of the electrical power module, at least one support comprising two angled metal portions that are angled relative to each other at an angle that is greater than 0°, each power component being fastened to two metal portions of two distinct supports by being positioned between said two metal portions, the electrical power module being arranged in such a manner that electrical power currents going to or coming from the power components flow in the metal portions of the supports.

17 Claims, 4 Drawing Sheets

(51) Int. Cl.
*H02P 27/06* (2006.01)
*H05K 1/02* (2006.01)
*H05K 1/18* (2006.01)
*H05K 7/20* (2006.01)

(52) U.S. Cl.
CPC ....... *H05K 7/1427* (2013.01); *H05K 7/20909* (2013.01); *H05K 7/20927* (2013.01)

(56) References Cited

U.S. PATENT DOCUMENTS

| | | | | |
|---|---|---|---|---|
| 7,352,576 B2* | 4/2008 | McClure | ................... | G06F 1/20 361/610 |
| 8,000,096 B2* | 8/2011 | Nemoz | ................ | H05K 7/1452 361/679.32 |
| 8,213,179 B2* | 7/2012 | Yoshida | ............. | H05K 7/20927 361/699 |
| 9,042,112 B2* | 5/2015 | Guan | ........................ | H05K 7/18 361/763 |
| 9,386,685 B2* | 7/2016 | Bonkohara | ........... | H01L 23/467 |
| 9,519,319 B2* | 12/2016 | Dean | ..................... | G01R 1/0408 |
| 9,531,170 B2* | 12/2016 | Pal | ....................... | H01R 25/162 |
| 10,483,189 B2* | 11/2019 | Uneme | ................ | H01L 23/4334 |
| 2004/0062006 A1* | 4/2004 | Pfeifer | .................. | H01L 23/473 361/699 |
| 2010/0165576 A1 | 7/2010 | Lee et al. | | |
| 2011/0056537 A1* | 3/2011 | Luch | ................... | H01L 31/0504 136/244 |
| 2013/0069108 A1* | 3/2013 | Lee | ..................... | H01L 23/4824 257/133 |
| 2013/0113114 A1* | 5/2013 | Hosseini | ........... | H01L 23/49575 257/777 |
| 2014/0015119 A1* | 1/2014 | Bonkohara | ......... | H01L 25/0657 257/713 |
| 2016/0105004 A1* | 4/2016 | Baeumel | ........... | H01L 23/49537 361/624 |
| 2017/0238440 A1* | 8/2017 | Claeys | ................... | H04Q 1/025 361/694 |

\* cited by examiner

ELECTRICAL POWER MODULE

The invention relates to the field of electrical power modules.

BACKGROUND OF THE INVENTION

In entirely conventional manner, an electrical power module includes semiconductors acting as switches. The semiconductors are mounted on an electrically insulating substrate.

By way of example, an electrical power module may comprise an inverter for driving an electric motor of an electromechanical actuator.

By way of example, the semiconductors may be power transistors of the following types: junction field effect transistor (JET); insulated-gate bipolar transistor (IGBT); or metal oxide semiconductor field effect transistor (MOSFET).

By way of example, the substrate may be constituted by a ceramic layer that presents a layer of metal laminated on each of its faces. In addition to providing electrical insulation, the substrate serves to transfer the heat flux dissipated by the semiconductors.

Such an electrical power module also conventionally includes a soleplate that removes the heat flux and that mechanically supports of the electrical power module. The soleplate is generally made of copper or of aluminum, and it is usually mounted on a heatsink.

In operation, the electrical power module generates temperature cycles that can be quite severe. The temperature cycles produce high levels of mechanical stress in the substrate and at the interfaces between the substrate and the semiconductors. These mechanical and thermal stresses give rise to multiple failure modes for the electrical power module, and they tend to increase the probability of a fault occurring in the electrical power module.

Object of the Invention

An object of the invention is to reduce the probability of a failure occurring in an electrical power module.

SUMMARY OF THE INVENTION

In order to achieve this object, there is provided an electrical power module comprising power components and supports, each including at least one metal portion, the metal portions of the supports forming a substrate of the electrical power module, at least one support comprising two angled metal portions that are angled relative to each other at an angle that is greater than 0°, each power component being fastened to two metal portions of two distinct supports by being positioned between said two metal portions, the electrical power module being arranged in such a manner that electrical power currents going to or coming from the power components flow in the metal portions of the supports.

The supports of the electrical power module in which the electrical power currents flow serve to dissipate heat simultaneously in three modes: by conduction, by convention, and by radiation. This heat dissipation is particularly effective. Furthermore, the substrate of the electrical power module is made of metal and does not include a ceramic layer that could be weakened by thermal cycling.

There is also provided an electromechanical actuator comprising both an electrical power module as described above and also an electric motor.

The invention can be better understood in the light of the following description of a particular, nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
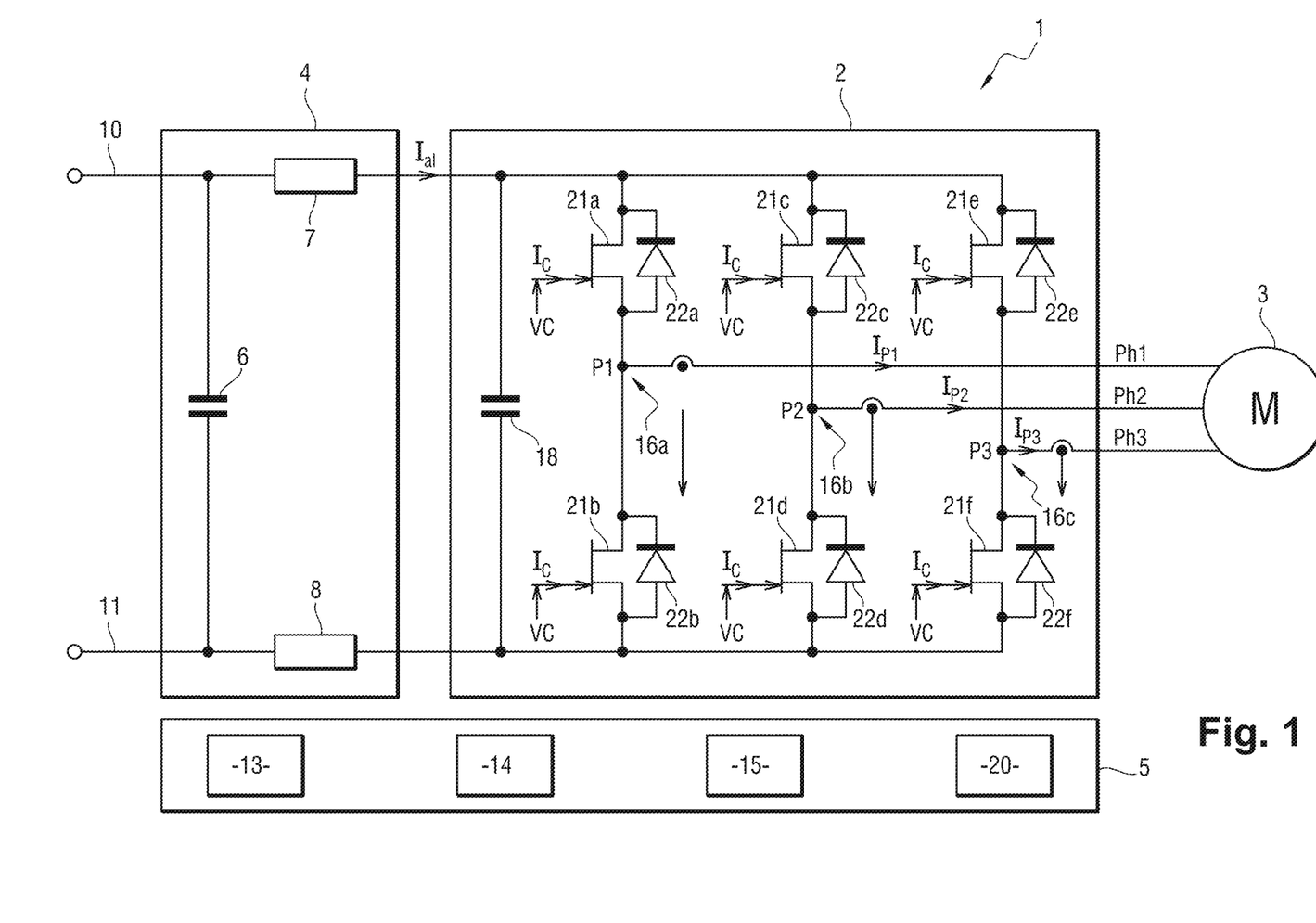
FIG. 1 is a circuit diagram of an inverter of an electrical power module of the invention.

With reference to FIG. 1, the electrical power module of the invention 1 includes power components forming an inverter 2.

The inverter 2 forms part of an electrical system integrated in an electromechanical actuator.

In addition to the electrical system, the electromechanical actuator comprises a three-phase electric motor 3 (together with other elements that are not shown, and in particular an actuator member). The motor 3 is powered and driven via the inverter 2.

In addition to the inverter 2, the electrical system comprises a connection circuit 4 and an additional module 5.

The connection circuit 4 comprises a connection capacitor 6, a first connection component 7, and a second connection component 8.

The connection circuit 4 is connected to a power generator that is not shown in FIG. 1, which generator produces a positive direct current (DC) power supply voltage on a positive power supply conductor 10 and a negative DC power supply voltage on a negative power supply conductor 11. The power generator also produces electrical power supply current Ia1 that flows in the positive power supply conductor 10 and in the negative power supply conductor 11.

The connection capacitor 6 is connected in parallel between the positive power supply conductor 10 and the negative power supply conductor 11.

The first connection component 7, represented by an impedance, is connected in series in the positive power supply conductor 10. The second connection component 8, represented by an impedance, is connected in series in the negative power supply conductor 11.

In conventional manner, the additional module 5 comprises a control circuit 13, a monitor circuit 14, a protection circuit 15, and a measurement circuit 20. The circuits of the additional module 5 are used in particular for controlling the inverter 2 and thus the motor 3, and for monitoring and protecting the inverter 2 and the motor 3.

The power components of the inverter 2 comprise a capacitor 18 connected in parallel between the positive power supply conductor 10 and the negative power supply conductor 11, together with three bridge arms 16 connected in parallel, and each comprising two transistors 21 of JFET type. In a given bridge arm 16 and in any single stage of operation, the two transistors 21 interrupt the signal in alternation when their triggers are actuated sequentially.

A respective diode 22 is connected between the drain and the source of each transistor 21.

There are thus defined: a first bridge arm 16a comprising a first transistor 21a, a first diode 22a, a second transistor 21b, and a second diode 22b; a second bridge arm 16b comprising a third transistor 21c, a third diode 22c, a fourth transistor 21d, and a fourth diode 22d; and a third bridge arm 16c comprising a fifth transistor 21e, a fifth diode 22e, a sixth transistor 21f, and a sixth diode 22f.

A first midpoint P1 is situated in the first bridge arm 16a between the first transistor 21a and the second transistor 21b. A second midpoint P2 is situated in the second bridge arm 16b between the third transistor 21c and the fourth transistor 21d. A third midpoint P3 is situated in the third bridge arm 16c between the fifth transistor 21e and the sixth transistor 21f.

The first midpoint of P1 is connected to a first phase Ph1 of the motor 3, the second midpoint P2 is connected to a second phase Ph2 of the motor 3, and the third midpoint P3 is connected to a third phase Ph3 of the motor 3.

The grids of the transistors 21 are connected to the control circuit 13 of the additional module 5. The control circuit 13 generates electrical control currents Ic at electrical control voltages Vc that are applied to the grids of the transistors 21 in order to control the transistors 21 and thus the motor 3.

The drains of the first, third, and fifth transistors 21a, 21c, and 21e are connected to the positive power supply conductor 10.

The sources of the second, fourth, and sixth transistors 21b, 21d, and 21f are connected to the negative power supply conductor 11.

The sources of the first, third, and fifth transistors 21a, 21c, and 21e are respectively connected to the drains of the second, fourth, and sixth transistors 21b, 21d, and 21f.

A first phase current Ip1 for the first phase Ph1 of the motor 3 is produced by the first bridge arm 16a. A second phase current Ip2 for the second phase Ph2 of the motor 3 is produced by the second bridge arm 16b. A third phase current Ip3 for the third phase Ph3 of the motor 3 is produced by the third bridge arm 16c.

The first phase current Ip1, the second phase current Ip2, and the third phase current Ip3 are alternating current (AC) output currents from the inverter 2 that power the motor 3.

Figure 2:
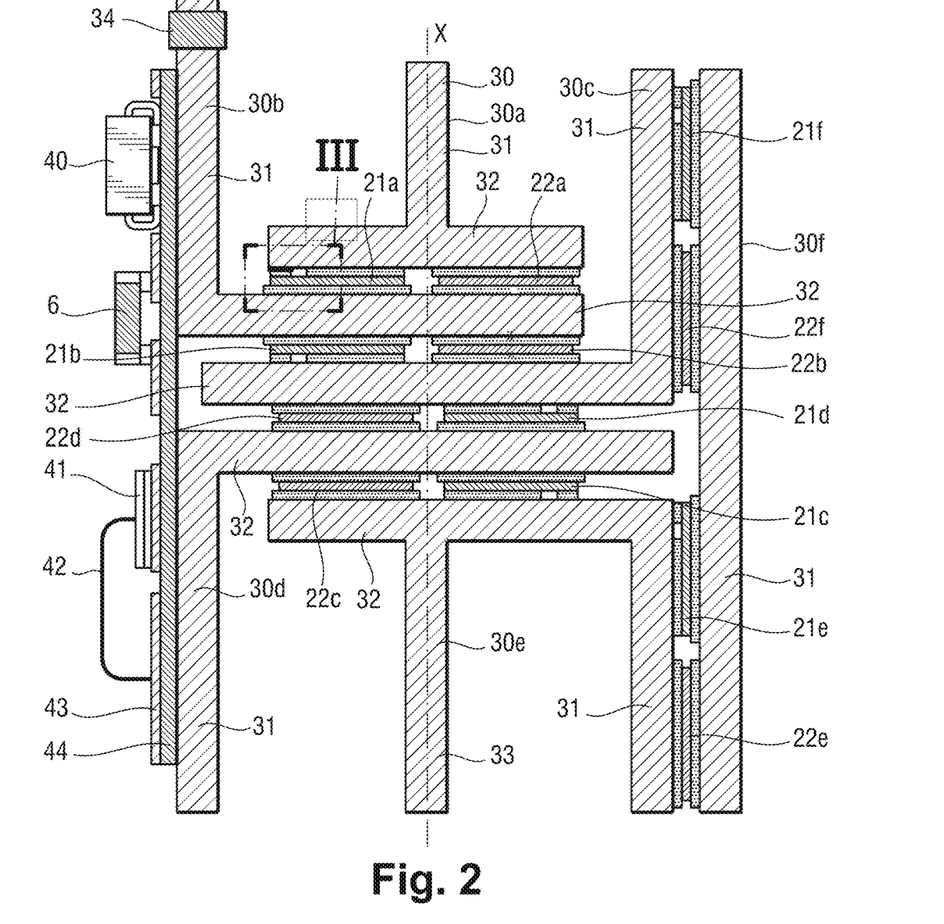
FIG. 2 is a section view of the electrical power module of the invention.

With reference to FIG. 2, the electrical power module 1 includes supports 30 that carry the power components of the inverter 2.

The supports 30 are assembled together in such a manner that the electrical power module 1 presents an outside shape that is generally tubular, of circular section and of longitudinal axis X.

In this example, the supports 30 comprise a first support 30a, a second support 30b, a third support 30c, a fourth support 30d, a fifth support 30e, and a sixth support 30f.

FIG. 2 is a section view of the electrical power module on a plane parallel to the axis X and containing the axis X.

In FIG. 2, the first support 30a is T-shaped. The first support 30a has a first metal portion 31 and a second metal portion 32 that are angled relative to each other at an angle greater than 0°. In this example, the first metal portion 31 and the second metal portion 32 are mutually orthogonal.

The second support 30b, the third support 30c, and the fourth support 30d are all right-angle shaped. Thus, each of the second, third, and fourth supports 30b, 30c, and 30d has respective first and second metal portions 31 and 32 that are angled relative to each other at an angle greater than 0°. In this example, the first and second metal portions 31 and 32 are mutually orthogonal.

The fifth support 30e is in the shape of a letter F, having a first metal portion 31, a second metal portion 32, and a third metal portion 33.

The second metal portion 32 of the fifth support 30e is angled relative both to the first metal portion 31 and also to the third metal portion 33 of the fifth support 30e by an angle greater than 0°.

Specifically, the second metal portion 32 of the fifth support 30e is orthogonal to both of the first and the third metal portions 31 and 33 of the fifth support 30e.

The sixth support 30f is rectilinear in shape and comprises a first metal portion 31.

The first metal portions 31 of the supports 30 are parallel to one another and to the axis X.

The second metal portions 32 of the supports 30 are parallel to one another and orthogonal to the axis X.

In this example, the angles between the metal portions are determined at the time the electrical power module is fabricated.

These angles serve to optimize integration of the electrical power module in a housing or in any environment. In particular, the accesses to the inputs and to the outputs of the electrical power module, and specifically the accesses to the input connectors and to the output connectors situated on the metal portions of the supports, may be at angles that are freely chosen in three dimensions.

Both the first transistor 21a and the first diode 22a are fastened both to the second metal portion 32 of the first support 30a and also to the second metal portion 32 of the second support 30b by being positioned between said second metal portions 32.

The first transistor 21a and the first diode 22a each have one face that is fastened to the second metal portion 32 of the first support 30a by sintering, using a sintering material that includes powdered silver.

The first support 30a is thus electrically connected to the drain of the first transistor 21a and to the cathode of the first diode 22a.

The first transistor 21a and the first diode 22a each have another face that is fastened to the second metal portion 32 of the second support 30b by sintering, using a sintering material.

The second support 30b is thus electrically connected to a source of the first transistor 21a and to an anode of the first diode 22a.

The second transistor 21b and the second diode 22b are fastened in the same manner to the second metal portions 32 of the second support 30b and of the third support 30c.

The second support 30b is thus electrically connected to a source of the second transistor 21b and to an anode of the second diode 22b. The third support 30c is thus electrically connected to a drain of the second transistor 21b and to a cathode of the second diode 22b.

The fourth transistor 21d and the fourth diode 22d are fastened in the same manner to the second metal portions 32 of the third support 30c and of the fourth support 30d.

The third support 30c is thus electrically connected to a drain of the fourth transistor 21d and to a cathode of the fourth diode 22d. The fourth support 30d is thus electrically connected to a source of the fourth transistor 21d and to an anode of the fourth diode 22d.

The third transistor 21c and the third diode 22c are fastened in the same manner to the second metal portions 32 of the fourth support 30d and of the fifth support 30e.

The fourth support 30d is thus electrically connected to a source of the third transistor 21c and to an anode of the third diode 22c. The fifth support 30e is thus electrically connected to a drain of the third transistor 21c and to a cathode of the third diode 22c.

The sixth transistor 21f and the sixth diode 22f are fastened in the same manner to the second metal portions 32 of the third support 30c and of the sixth support 30f.

The third support 30c is thus electrically connected to a drain of the sixth transistor 21f and to a cathode of the sixth diode 22f. The sixth support 30f is thus electrically connected to a source of the sixth transistor 21f and to an anode of the sixth diode 21f.

The fifth transistor 21e and the fifth diode 22e are fastened in the same manner to the second metal portions 32 of the fifth support 30e and of the sixth support 30f.

The fifth support 30e is thus electrically connected to a drain of the fifth transistor 21e and to a cathode of the fifth diode 22e. The sixth support 30f is thus electrically connected to a source of the fifth transistor 21e and to an anode of the fifth diode 22e.

The finishing of the transistors 21 and the diode 22, i.e. the metallization of their contacts, may comprise any metal material, and in particular the following materials: Ag, Au, Pd, Al, Cu, Ni, etc.

Electrical power currents, coming from or going to the transistors 21, flow in the metal portions 32 of the supports 30.

The electrical power currents comprise the power supply electric current Ia1, the first phase current Ip1, the second phase current Ip2, and the third phase current Ip3.

The first support 30a is connected to the positive power supply conductor 10, and the power supply current Ia1 flows in the first metal portion 31 and in the second metal portion 32 of the first support 30a. The drain of the first transistor 21a and the cathode of the first diode 22a are thus taken to the positive DC power supply voltage.

The fifth support 30e is connected to the positive power supply conductor 10, and the power supply current Ia1 flows in the first metal portion 31 and in the second metal portion 32 of the fifth support 30e. The drains of the third transistor 21c and of the fifth transistor 21e, and the cathodes of the third diode 22c and of the fifth diode 22e, are thus taken to the positive DC power supply voltage.

The third support 30c is connected to the negative power supply conductor 11, and the power supply current Ia1 flows in the first metal portion 31 and in the second metal portion 32 of the third support 30c. The sources of the second, fourth, and sixth transistors and 21b, 21d, and 21f, and the anodes of the second, fourth, and sixth diodes 21b, 22d, and 22f are thus taken to the negative DC power supply voltage.

The first, second, and third phase currents Ip1, Ip2, and Ip3 flow respectively in the second, fourth, and sixth supports 30b, 30d, and 30f, going respectively to the first, second, and third phases Ph1, Ph2, and Ph3 of the motor 3.

The second support 30b, the fourth support 30d, and the sixth support 30f are all covered at least in part in ferromagnetic ceramic 34. On these supports, the ferromagnetic ceramic 34 forms filters for high frequency interference. The ferromagnetic ceramic is applied by the "additive fabrication" technique, or by the 3D-Mechatronic Integrated Devices (3D-MID) technology.

The thickness Es of at least one support 30 is such that:

$$5 \cdot Ep < Es < 30 \cdot Ep$$

where the power components mounted on said support 30 present a mean thickness of Ep.

Figure 3:
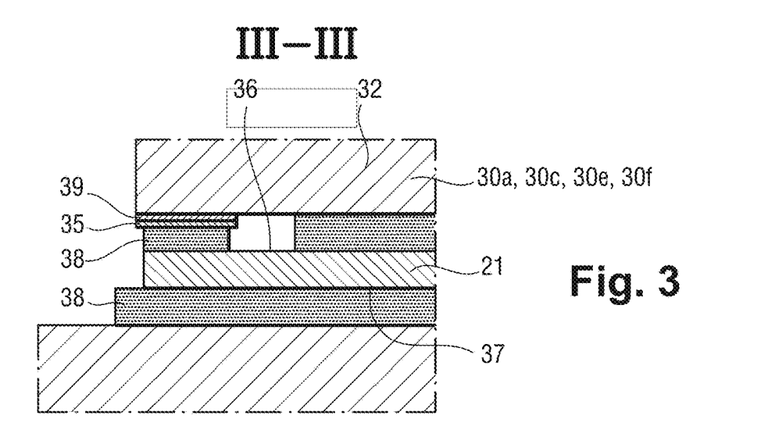
FIG. 3 is a detail view of FIG. 2.

With reference to FIG. 3, it should be observed that the first, third, fifth, and sixth supports 30a, 30c, 30e, and 30f also carry tracks 35 that convey the electrical control currents Ic to the grids of the transistors 21.

Each transistor 21 presents a first face 36 having a first conductive element connected to the drain of the transistor 21 and a second conductive element connected to the grid of the transistor 21, and a second face 37 having a third conductive element connected to the source of the transistor 21.

As explained above, the sintering material 38 is arranged on the first, second, and third conductive elements.

Between the sintering material 38 arranged on the second conductive element and the metal portion 32, there are both a track 35 and an insulating layer 39. The insulating layer 39 insulates the track 35 from the metal portion 32 of the support 30 that conveys the power current (power supply current or phase current).

In this example, the track 35 comprises a conductive material including silver and an oxide. The conductive material is dispersed in a binder suitable for silk-screen printing.

In this example, the insulating layer 39 comprises an inorganic insulator of the glass frit type. The inorganic insulating material is dispersed in a binder suitable for silk-screen printing.

The electronic power module 1 serves to dissipate heat by isotropic energy transfer between the transistors 21 through the substrate constituted by the support 30.

Heat dissipation takes place simultaneously in three modes: by conduction, by convection, and by radiation. The dissipation of heat can be enhanced by using a thermally conductive element for fabricating the supports 30, having outlines that are conducive to good emissivity. These outlines are advantageously formed by using the "additive fabrication" technique.

It should also be observed that electrical components are arranged on the outside surface of the electrical power module 1. The electrical components comprise the connection capacitor 6, together with a component 40 and an integrated circuit or "chip" 41. The chip 41 is connected by wire bonding 42 to a track 43. These electrical components are mounted on a substrate 44, which is a conventional substrate in this part of the circuit.

Figure 4:
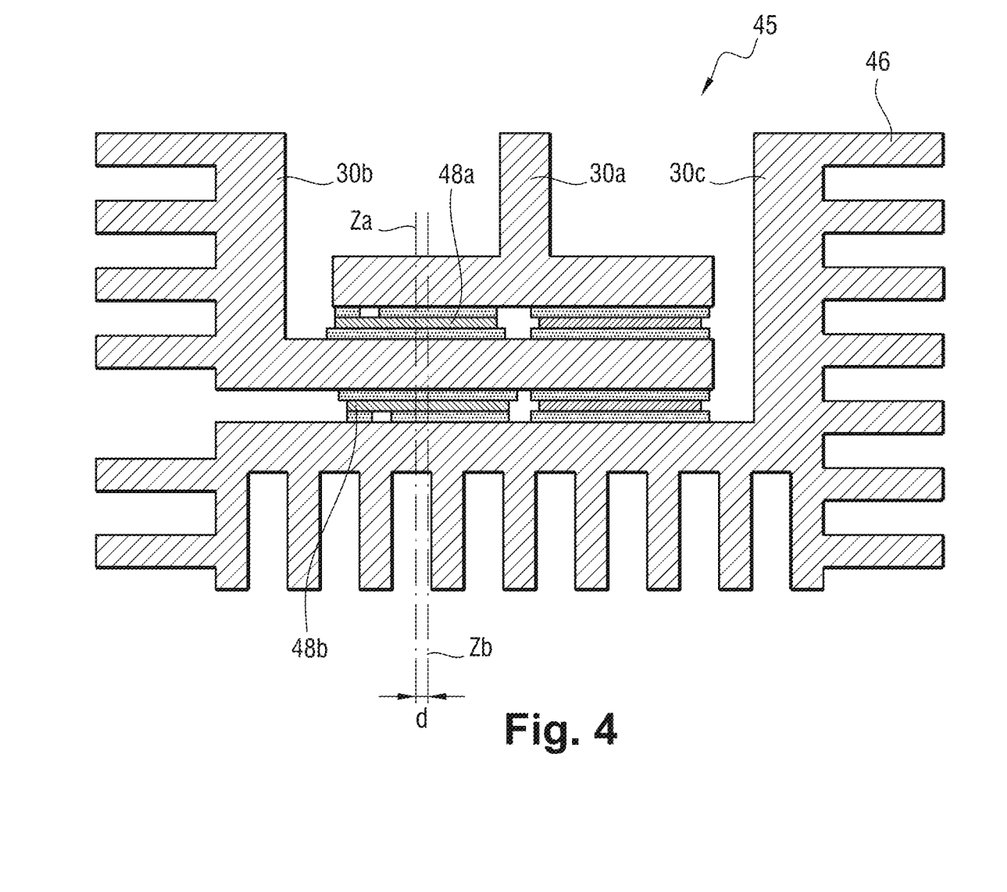
FIG. 4 is a section view of a generic power cell of the electrical power module of the invention.

With reference to FIG. 4, the arrangement of the support 30 is based on a generic power cell 45 that comprises the first support 30a, the second support 30b, and the third support 30c. It should be observed that, in FIG. 4, the second support 30b and the third support 30c are provided with heat-dissipator fins 46 that enhance the cooling of the electrical power module.

This generic cell 45, which forms a bridge arm 16 comprising a first transistor 48a and a second transistor 48b, can be duplicated as many times as necessary in order to create any power function.

It should be observed that the first transistor 48a and the second transistor 48b are positioned on opposite sides of the second support 30b, being superposed and centered relative to each other. A first axis Za perpendicular to a face of the first transistor 48a and passing through the center of said face is spaced apart from a second axis Zb perpendicular to a face of the second transistor 48b and passing through the center of said face by a distance d that is less than or equal to one third of the diagonal of the face having the larger area.

This generic cell 45 could be configured differently, i.e. the support 30 could present shapes that are different, or they could be arranged differently relative to one another.

A plurality of generic cells 45 of various shapes could be used to make an electrical power module 1 that complies with any type of requirement for integration purposes.

Figure 5:
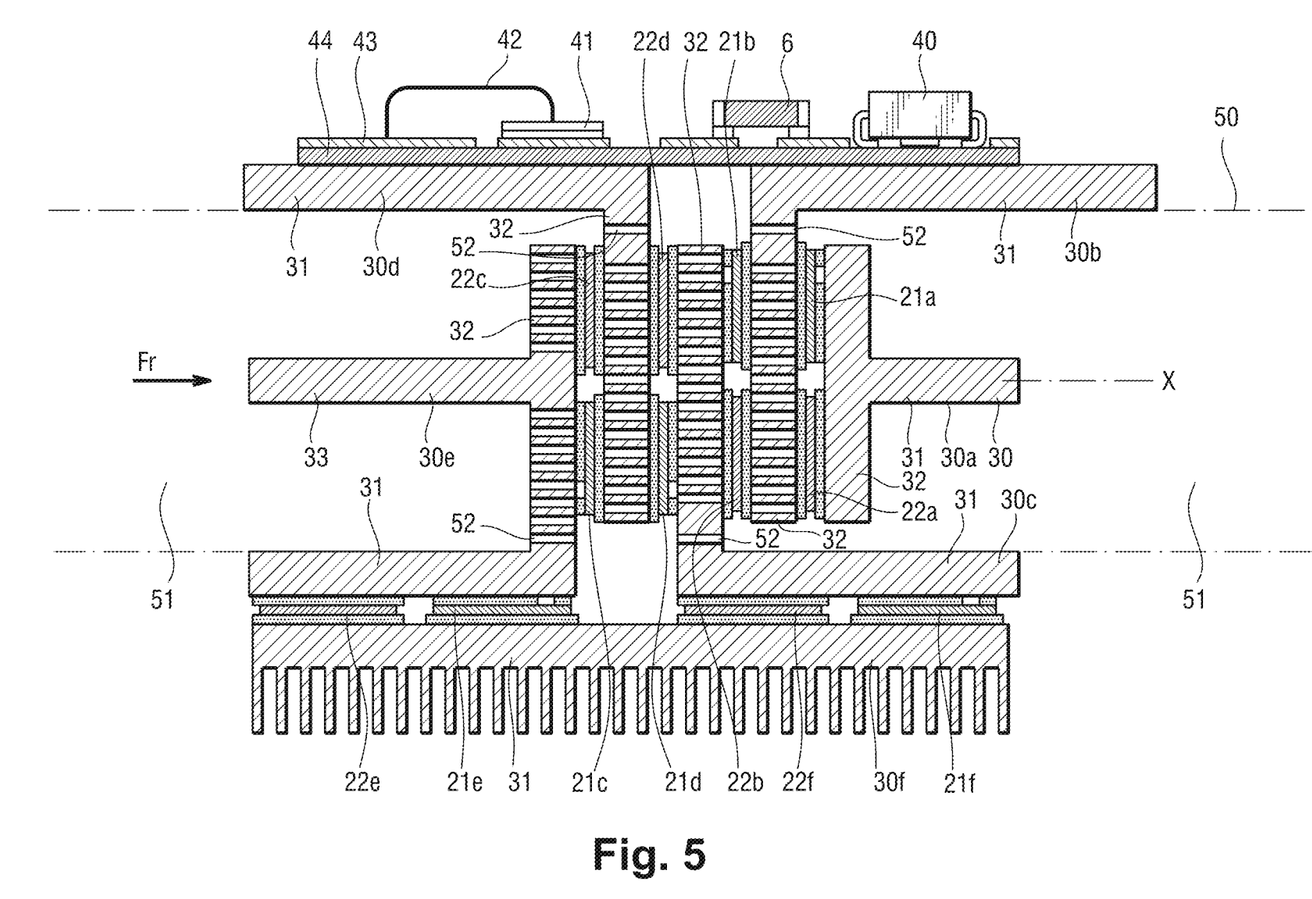
FIG. 5 is a section view of the electrical power module of the invention, on which a plastics material cover is shown.

With reference to FIG. 5, the electrical power module 1 includes a leak-tight cover 50 that is made of plastics material and tubular in shape. In this example, the cover 50 is fastened to the second support 30b, to the third support 30c, to the fourth support 30d, and to the fifth support 30e.

The support 30 and the cover 50 define a channel 51 inside the electrical power module 1.

A cooling fluid Fr, e.g. a heat-transfer liquid or gas, thus flows in the channel 51 that is defined by the support 30 and by the cover 50. The fluid passes through the second support 30b, the third support 30c, and the fourth support via orifices 52 made in these supports. Cooling liquid flowing in the channel 51 enables the electrical power module 1 to be cooled very effectively.

The cooling fluid serves to insulate the electrical power module. In this example, the flow speed of the cooling liquid is about 0.001 meters per second (m/s). The flow speed serves to guarantee that no partial discharges occur during electrical switching of the switches formed by the transistors 21.

The outlines of the supports 30 are of dimensions for giving rise to a large area for heat exchange with the cooling fluid.

Advantageously, the supports 30, and in particular the first metal portions 31 and the second metal portions 32, are made using the additive fabrication technique. By way of example, the material used is aluminum. It is thus possible to define cooling channels inside the first metal portions 31 and inside the second metal portions 32 of the support 30.

The resulting thermal performance is inversely proportional to the diameter of the cooling channels, however the hydraulic head loss balance is proportional to the diameter of the cooling channels.

For cooling channels having diameters lying in the range 10 micrometers ($\mu$m) to 800 $\mu$m, the heat exchanger is said to be a "microchannel" heat exchanger. For cooling channels having diameters lying in the range 1 millimeters (mm) to 10 mm, the heat exchanger is said to be a "minichannel" heat exchanger. For cooling channel diameters greater than 10 mm, the term used is "cold plate" cooling.

During fabrication of the electrical power module, first insulation is initially applied by thick-layer silk-screen printing on each face of the supports 30 carrying the transistors 21. Thereafter, the components are mounted on the supports 30, and the electrical power module is assembled. Second insulation is then deposited by a plasma method, by vapor phase deposition, by evaporation, or by rolling. This forms a coating that is without cracks or bubbles, and that presents variations of thickness that are less than 1 $\mu$m. This coating covers and insulates all of the inside and outside surfaces of the electrical power module.

Finally, the electrical power module is covered in a resin or is integrated in a protective package. This serves to protect the electrical insulation from external mechanical stresses that might give rise to scratches, bruising, crushing, etc. The input and output connectors, used for connecting the electrical power module to a motor or to some other equipment, are left free.

Naturally, the invention is not limited to the embodiment described, but covers any variant coming within the ambit of the invention as defined by the claims.

The above-described electrical power module comprises an inverter, however the invention may naturally be applied to any type of electrical power module implementing any type of power function.

The number of bridge arms could naturally be different, as could the power components used.

Although it is stated that the components are fastened to the supports by sintering, other fastening means could be used, e.g. soldering or adhesive.

In the above description, the first metal portions 31 and the second metal portions 32 are mutually orthogonal. Nevertheless, a first metal portion and a second metal portion of at least one support could be angled relative to each other at some other angle, providing the angle is greater than 0°.

It is also stated that the angle between the metal portions is determined at the time the electrical power module is fabricated. It is also possible to make provision for one or more of the angles to be adjusted at the moment the electrical power module is integrated in a housing containing said electrical power module. The metal portions should then be fastened together by fastener means that enable the angle between them to be adjusted.

The invention claimed is:

1. An electrical power module comprising:
   power components; and
   supports, each of the supports comprising at least one metal portion, the metal portions of the supports together forming a substrate of the electrical power module each power component being fastened to two metal portions of two distinct supports by being positioned between said two distinct supports,
   wherein the electrical power module is arranged in such a manner that electrical power currents going to or coming from the power components flow in the metal portions of the supports,
   wherein at least one of the supports is an angled support comprising a first metal portion and a second metal portion that are mutually orthogonal,
   wherein at least a first power component among said power components, is fastened to the first metal portion of said angled support, and at least a second power component, among said power components and distinct from the first power component, is fastened to the second metal portion of said angled support.

2. The electrical power module according to claim 1, wherein the first metal portion and the second metal portion are fastened together by fastener means, and
   wherein the two first metal portion and the second metal portion are arranged in such a manner that the angle between them can be adjusted when the electrical power module is integrated in a housing, the fastener means enabling the angle between the first metal portion and the second metal portion to be adjusted.

3. The electrical power module according to claim 1, wherein the power components include controllable components, the electrical power module including tracks for conveying electrical control currents for the controllable components, each track being insulated from a metal portion of a support by an electrically insulating layer.

4. The electrical power module according to claim 3, wherein at least one of the tracks comprises a conductive material including silver and an oxide, the conductive material being dispersed in a binder suitable for silk-screen printing.

5. The electrical power module according to claim 3, wherein the electrically insulating layer comprises an inorganic insulating material of the glass frit type, the inorganic insulating material being dispersed in a binder suitable for silk-screen printing.

6. The electrical power module according to claim 1, wherein one face of each power component is fastened to a metal portion of a support by sintering.

7. The electrical power module according to claim 1, wherein the supports are partially covered in ferromagnetic ceramic forming lowpass filters.

8. The electrical power module according to claim 1, wherein the supports define a channel inside the electrical power module, the electrical power module being arranged in such a manner that a fluid flows in the channel in order to cool the electrical power module.

9. The electrical power module according to claim 8, further including a leak-tight plastics material cover that also defines the channel, the cover being fastened to supports.

10. The electrical power module according to claim 1, wherein the supports are fabricated by using an additive fabrication technique.

11. The electrical power module according to claim 1, wherein cooling channels are defined inside the supports.

12. The electrical power module according to claim 1, including at least three supports.

13. The electrical power module according to claim 1, wherein at least one of the supports is of a thickness Es such that:

$$5 \cdot Ep < Es < 30 \cdot Ep$$

where the chips of the power components mounted on said at least of the supports present a mean thickness of Ep.

14. The electrical power module according to claim 1, the power components include two transistors and two diodes forming a single bridge arm, the electrical power module including a first support in which there flows a power supply electric current at a positive DC power supply voltage, a second support in which there flows an AC output current, and a third support-in which there flows a power supply electric current at a negative DC power supply voltage.

15. The electrical power module according to claim 14, including a first transistor and a second transistor forming a single bridge arm, the first transistor and the second transistor being positioned on either side of a single support so as to be superposed and centered relative to each other.

16. The electrical power module according to claim 15, wherein a first axis perpendicular to a face of the first transistor and passing through the center of said face is spaced apart from a second axis perpendicular to a face of the second transistor and passing the center of said face by a distance that is less than or equal to one third of the length of a diagonal of the face having the larger area.

17. An electromechanical actuator comprising the electrical power module according to claim 14 and an electric motor.

* * * * *